United States Patent [19]
Klink et al.

[11] 4,153,127
[45] May 8, 1979

[54] STRUCTURAL UNIT FOR AN ELECTRIC VEHICLE

[75] Inventors: Rainer Klink, Stetten-Rommelshausen; Günther König, Bittenfeld, both of Fed. Rep. of Germany

[73] Assignee: Firma Deutsche Automobilgesellschaft mbH, Fed. Rep. of Germany

[21] Appl. No.: 718,765

[22] Filed: Aug. 30, 1976

[30] Foreign Application Priority Data

Aug. 30, 1975 [DE] Fed. Rep. of Germany ....... 2538744

[51] Int. Cl.² .............................................. B60L 15/00
[52] U.S. Cl. ..................................... 180/65 R; 180/90;
220/331; 220/345; 224/42.46 R; 312/333;
312/350; 339/184 M; 361/391; 361/392
[58] Field of Search .............. 180/90, 65 R; 224/29 K,
224/42.41, 42.46 R; 220/345, 331, 255;
312/333, 350; 361/391, 392, 390; 339/184 R,
184 M

[56] References Cited

U.S. PATENT DOCUMENTS

| | | | |
|---|---|---|---|
| 983,258 | 1/1911 | Bliss | 339/184 M X |
| 1,458,166 | 6/1923 | Cox | 220/255 |
| 1,809,296 | 6/1931 | Heina | 180/90 X |
| 2,175,025 | 10/1939 | Hooven | 312/350 X |
| 2,514,246 | 7/1950 | Knox | 361/391 |
| 2,607,518 | 8/1952 | Cohen | 224/42.41 |
| 2,793,092 | 5/1957 | Peterson | 220/345 X |
| 2,855,454 | 10/1958 | Alden | 361/391 |
| 3,180,697 | 4/1965 | Mulch | 220/345 X |

FOREIGN PATENT DOCUMENTS

1505456 1/1970 Fed. Rep. of Germany ............. 180/90
743217 1/1956 United Kingdom ..................... 312/333

OTHER PUBLICATIONS

*Antriebstechnik für Elektroautos,* vol. 94, 1973, issue 11, p. 691 et seq. of ET-A.

*Primary Examiner*—John P. Silverstrim
*Attorney, Agent, or Firm*—Craig & Antonelli

[57] ABSTRACT

A structural unit for an electric vehicle which includes a box-like slide-in unit containing the electrical, electronic, and electro-mechanical structural elements for the control and regulation of the operating currents and voltages. The slide-in unit which is adapted to be securely connected with the vehicle, consists of a box-shaped slide-in tray provided with guide arrangement and of a support frame also provided with guide arrangement and adapted to be securely fastened at the vehicle. For purposes of establishing the electrical contacts, complementary plug-in contacts are arranged at corresponding places of the support frame and of the box-like slide-in unit whereby the top cover plate is removable at the slide-in unit and the front plate thereof is adapted to be tilted down while the slide-in unit itself is held in the support frame by means of clamping bolts.

17 Claims, 4 Drawing Figures

STRUCTURAL UNIT FOR AN ELECTRIC VEHICLE

The present invention relates to a structural unit for an electric vehicle, which includes a slide-in unit containing the electrical, electronic and electromechanical structural elements for the control and regulation of the operating currents and voltages.

A structural unit of this type is described in the publication ETZ-A Volume 94, 1973, issue 11, pages 691 et seq. This prior art structural unit is constructed as a console installed in lieu of the engine into the engine space of a series-produced vehicle, on which are secured a number of protective circuit breakers, a D.C. regulator of semi-conductor construction, a number of diodes and further structural elements necessary for the control and regulation of the driving and braking operation of the vehicle. The feed or supply cables coming from the battery and the control lines coming from the command elements initiating the acceleration or braking operation, are connected in the prior art structural unit by means of customary connector lugs and threaded connections with the regulating and control elements of the structural unit. This entails the disadvantage that for purposes of removing the structural unit, for example, for the examination thereof or exchange of a damaged structural element accessible from the outside only with difficulty, numerous threaded connections have to be removed before the console can be removed out of the vehicle. A further disadvantage of the prior art structural unit resides in that the supply cables coming from the battery may come into contact with their cable connectors with the vehicle ground during the removal of the console, which may lead to short-circuits. Additionally, during the re-connection of the cables to the structural elements of the re-installed console, the danger exists that the connections are mixed up, which in connection with semi-conductor structural elements that are very sensitive against an incorrect polarity of the connections, may lead easily to the destruction thereof. Additionally, there also exists the danger of electrical injuries during the connection or disconnection of structural elements which are arranged at places of the structural unit that cannot be readily viewed or seen, since the battery voltages used for electric vehicles already at present are within the 200 volts range and therewith are of an order of magnitude which may lead to fatal injuries. The servicing and possibly the repair of the prior art structural unit can therefore be undertaken only by specially schooled personnel and therebeyond involves a great amount of work and is costly so that it is hardly suitable for series manufacture or mass production.

Accordingly, the aim of the present invention resides in providing a structural unit of the aforementioned type whose servicing is simple and reliable and can at least be prepared by unschooled personnel, and which also makes it possible to rapidly exchange in a simple manner the individual structural elements.

The underlying problems are solved according to the present invention in that for purposes of establishing the electrical contacts of the structural elements contained in the slide-in unit with a supply battery and with the motor, fixedly arranged complementary parts of plug-in contacts are provided at the slide-in unit, on the one hand, and at the vehicle, on the other, which come into engagement with one another when the slide-in unit is pushed into the vehicle whereby the supply current sources can be fixedly wired to the plug-in contact parts fixedly arranged at the vehicle, on the one hand, and the structural elements can be fixedly wired to the plug-in contact parts arranged at the slide-in unit, on the other, so that no electric lines can come into contact with the vehicle ground when pulling out the slide-in unit out of the vehicle and might lead to undesired short-circuits. It then becomes unnecessary for purposes of taking out the slide-in unit, that an installer comes into contact with the customary current-carrying parts since the pulling out of the slide-in unit already leads to a disengagement of all electrical connections so that with a subsequent separation of electrical connections between structural elements of the structural unit, it is assured in every case that the same are no longer alive, i.e., are no longer connected with the electrical voltage source. A subsequent examination of the individual structural elements by means of a special diagnostic apparatus as is customary at present in the automotive industry in order to simplify the servicing of vehicles, can thus also be prepared by unschooled personnel and also possibly be carried out by the same, which may lead to a considerable reduction of the costs connected with the servicing. The present invention also offers the advantage that upon re-insertion of the slide-in unit, the correct connection is assured in every case by an unequivocal coordination of the complementary parts of the plug-in connections.

Such an unequivocal coordination of the plug-in contact parts with respect to one another may be assured, for example, in that the plug-in contacts are arranged asymmetrically so that they can be joined only in one way. However, also if the contacts are grouped approximately symmetrically about a center axis so that in principle two plug-in possibilities exist, or in cases in which a repeating arrangement of contacts is provided along an axis so that different plug-in possibilities exist offset about the division in question, whereby then respectively a portion of the contacts would remain free, or non-connected, an unequivocal coordination of the contact parts can be achieved with advantage in that a guidance is provided in which the slide-in units can be displaced in the direction toward the connecting parts fixedly arranged at the vehicle and can be brought into engagement with the same in an unequivocal coordination. For example, for that purpose, guide rails may be secured at the vehicle, on which the slide-in unit is movably or slidingly displaceably guided in the direction toward the contact parts rigidly connected with the vehicle, for example, by means of rollers.

According to one particularly advantageous construction of the present invention, the sockets of the plug-in contacts are arranged at a plate extending perpendicularly to the guide direction and provided at a support frame which is adapted to be connected with the vehicle and is provided with guide means for the slide-in unit, whereas the contact pins are arranged at an inner side wall of the slide-in unit extending parallel to this plate. The support frame may then be manufactured in a very simple manner outside of the vehicle in a form matched very accurately to the form of the slide-in unit and to the arrangement of the plug-in contact parts and may be connected with the vehicle by means of suitable fastening members. This offers the advantage that a very precise guidance of the slide-in unit and of its contact pins in the direction toward the contact sockets arranged at the support frame is assured also, when the support frame cannot be secured quite accurately in the vehicle at the place provided for its fastening. A further advantage of this construction of the present invention resides in that the structural unit including the slide-in unit and the support frame can be adapted in a simple manner to very different types of vehicles by a mere change of the connecting means of the support frame with the vehicle.

It is, however, also understood that the sockets of the plug-in contacts may also be arranged at the slide-in unit and the contact pins at the support frame or some of the sockets as well as some of the contact pins could also be provided at each of the slide-in unit and the support frame. However, since the contact pins as a rule are more exposed to the danger of damage than the contact sockets, it is appropriate to arrange all of the contact pins at the slide-in unit adapted to be pulled out so that they are readily interchangeable in case of need.

Of the order of 30 to 50 plug-in contacts are required for the connection of the structural elements contained in the slide-in unit with the supply battery, which may be dimensioned differently depending on the different current magnitudes in the individual structural elements. Whereas the D.C./A.C. converters and/or the D.C. regulator used for feeding the driving motor require contacts which must be able to withstand a starting current of several hundred amperes and therefore must be dimensioned mechanically very sturdily, the contact pins for the control and regulating electronics which control the power electronics and which are constructed as typical low-current electronics, may be constructed as relatively thin contact pins and may be arranged within a narrow space at a distance of only a few millimeters from one another. It is then necessary that the contact pins are guided very accurately in the direction toward the coordinated contact sockets during the displacement of the slide-in unit. Though the plates customarily made of synthetic resinous material such as "Pertinax", at which are arranged the contact sockets and the contact pins, may be made aligned very accurately mirror-image-like and the complementary elements of the plug-in contacts can be constructed corresponding accurately, the guidance for the slide-in unit will exhibit, as a rule, a certain play, so that the danger exists that the contact pins which are disposed very closely adjacent one another and are not constructed mechanically very sturdily, do not reach accurately the coordinated sockets during the sliding-in of the unit and may possibly be bent. It is therefore particularly advantageous, as is provided according to one embodiment of the present invention, if especially the sturdily constructed contact pins and sockets for the connection of the power electronics are constructed additionally as guide elements for the slide-in movement since the arrangement thereof with respect to the other more weakly constructed contact pins can be readily attained with the requisite accuracy and therewith an exact centering of all contact pins with respect to the associated sockets can be assured. Consequently, according to one embodiment of the present invention, the openings of the sockets are arranged in a common plane, and the base points of the contact pins of the slide-in unit are arranged in a plane arranged parallel thereto, whereby the lengths of the contact pin for the power electronics is greater than the length of the contact pins for the control electronics which then, in their turn, are adapted to be accurately centered when sliding-in the slide-in unit, with the aid of the sturdy contact pins for the power electronics within the scope of the guide clearance of the guidances of the support frame.

In order that the plug-in contacts do not become disengaged during the driving operation, it is necessary to suitably fix the slide-in unit in its end position. For example, automatic locking devices with latches or catches which retract during the slide-in movement, may be provided which, when the slide-in movement has arrived in its end position in which the plug-in contacts are joined together, drop into recesses or apertures of the side walls or come into abutment at a front plate of the slide-in unit and thereby prevent a return movement of the slide-in unit. If, however, as in the instant case, numerous plug-in contacts are present whose sockets include springy contact elements which abut under a considerable spring-stress at the contact pins, then as a rule, considerable forces are necessary in order to displace the slide-in unit into its end position. It is then often difficult to displace the slide-in unit into its end position against these forces which on the average may be of the order of magnitude of up to 1 kp per plug-in contact, whereby it should be noted that the insertion of the contact pins into the sockets should not take place jerk-like in order to avoid damages. It is therefore particularly advantageous, as is provided according to a preferred embodiment of the present invention, if clamping means engaging at the support frame in the direction of the guidance or of the axis of the plug-in contacts, are provided for fastening the slide-in unit at the support frame, which clamping means may be realized according to a further feature of the present invention in that the guidances of the support frame include U-shaped profile rails with legs pointing toward one another, in which the slide-in unit is displaceably guided by means of hollow profiles fixedly arranged at the side walls thereof, within which are rotatably arranged tension rods which include at their one, inner end a threaded section cooperating with a nut member of the support frame and which at their other outer end are supported against the outside of the slide-in unit.

These torsion rods may then be utilized both for the displacement of the slide-in unit into the engaging position of the plug-in contacts as also for the fixing thereof, whereby the forces necessary for the sliding-in movement can be metered very finely by means of rotary handles or knobs arranged at the outer ends of the torsion rods so that the contacts are protected in an optimum manner during the sliding-in movement.

It is further advantageous if the slide-in unit according to a further feature of the present invention, is supported with respect to the support frame in an end portion of its slide-in movement which is somewhat greater than the greatest length of the contact pins, by way of spring-elastic elements whose spring constant may be so dimensioned and selected that upon disengagement the slide-in unit moves outwardly automatically and uniformly under the influence of these spring-elastic elements against the tensional forces exerted on the contact pins by the springy contact elements of the sockets and jerk-like movements are avoided when taking out the slide-in unit.

These spring-elastic elements, according to one embodiment of the present invention, are constructed as spiral springs concentrically surrounding an inner end section of the tension rods having a small cross section, whereby these springs supported with their one end against a shoulder-shaped end surface of the outer section of the tension rod and with their other end at the support frame, and are arranged protected against soiling in the guide elements for the slide-in unit.

Such springy support elements additionally provide a further protection for the contact pins since they brake the forward movement of the slide-in unit when they come into abutment at the support frame so that the contact pins can come into engagement with the sockets in their engaging position only by actuation of the clamping means.

The structural unit according to the present invention by reason of the conveniently disengageable electrical plug contacts, distinguishes itself by a particularly high ease of servicing which according to a further development of the present invention can be increased also by a special configuration and construction of the slide-in unit, in which the slide-in unit is constructed as parallelepiped, flat box guided in horizontal guide means which extend up to the immediate vicinity of its outer front plate, whereby the box includes a top plate which is displaceable in guide means parallel to these guide means and adapted to be removed. The box-like slide-in unit can then be pulled out by a predetermined distance which corresponds nearly to the entire length of the box, and the top plate can be pulled out within its guide means, in case of need, only a certain distance or completely in order to enable access to the individual structural elements from above which, in this construction of the box, are preferably threadably secured at the bottom thereof so that they can be conveniently disengaged from above.

Such a slide-in unit constructed as flat box is suited not only as a horizontal slide-in unit but can also be constructed that it may also be arranged in trough-shaped recesses of the vehicle floor or approximately under the seat bench of a passenger motor vehicle by means of vertical guide means whereby the contact pins may then be arranged projecting downwardly from the bottom of the slide-in unit and the contact sockets may be arranged at the bottom of the trough or recess or vice-versa.

Accordingly, it is an object of the present invention to provide a structural unit for electric motor vehicles which avoids by simple means the aforementioned shortcomings and drawbacks encountered in the prior art.

Another object of the present invention resides in a structural unit for electric vehicles which is relatively simple in construction and easy to install and remove.

Still another object of the present invention resides in a structural unit for electric vehicles in which the electrical connections are established by the mere slide-in movement of a slide-in unit in such a manner that short-circuits as well as danger of injury to the personnel are avoided.

A still further object of the present invention resides in a structural unit for electrically driven vehicles in which the plug-in contacts are protected in a far-reaching manner against damage due to incorrect plug-in or as well as against external influences.

Another object of the present invention resides in a structural unit of the type described above in which the structural elements thereof are readily accessible for servicing, thereby also minimizing the time required by schooled personnel.

Still another object of the present invention resides in a structural unit for electrically driven vehicles whose service is simple and can at least be prepared by relatively untrained personnel.

A still further object of the present invention resides in a structural unit of the type descibed above in which the individual structural elements can be rapidly exchanged in a simple manner in case of need, without danger that any of them are still connected to the power supply at the time the service operations are undertaken.

Still another object of the present invention resides in a structural unit for electric vehicles which can be readily adapted to most different types of vehicles.

Another object of the present invention resides in a structural unit for electric vehicles in which the installation and removal of the slide-in structural unit can be undertaken in a simple manner, protecting all parts involved therein.

These and other objects, features and advantages of the present invention will become more apparent from the following description when taken in connection with the accompanying drawing which shows, for purposes of illustration only, one embodiment in accordance with the present invention and wherein.

Figure 1:
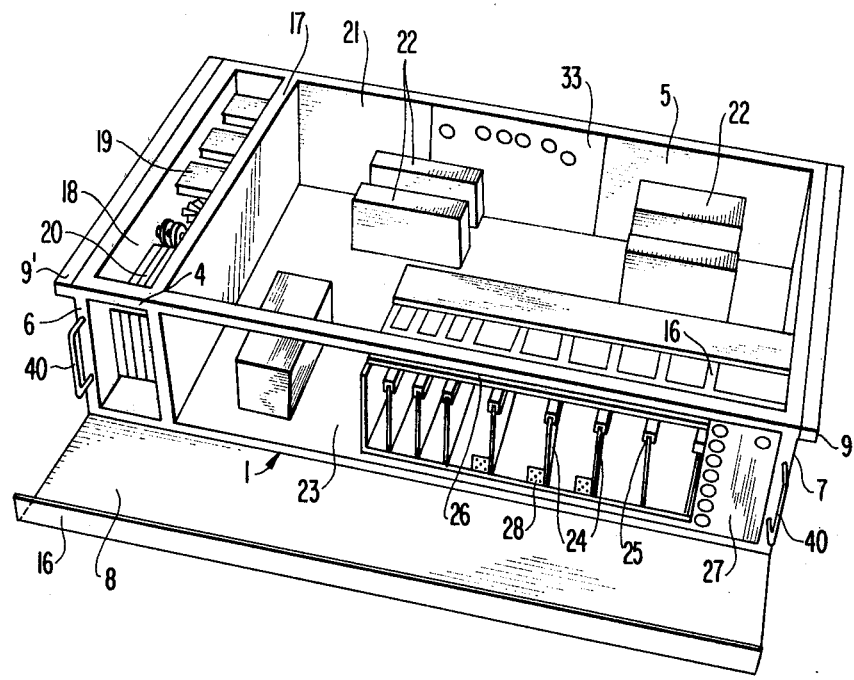
FIG. 1 is a perspective view of a slide-in structural unit according to the present invention, as viewed from in front and from above with a folded-down front flap and with a removed cover plate.
Figure 2:
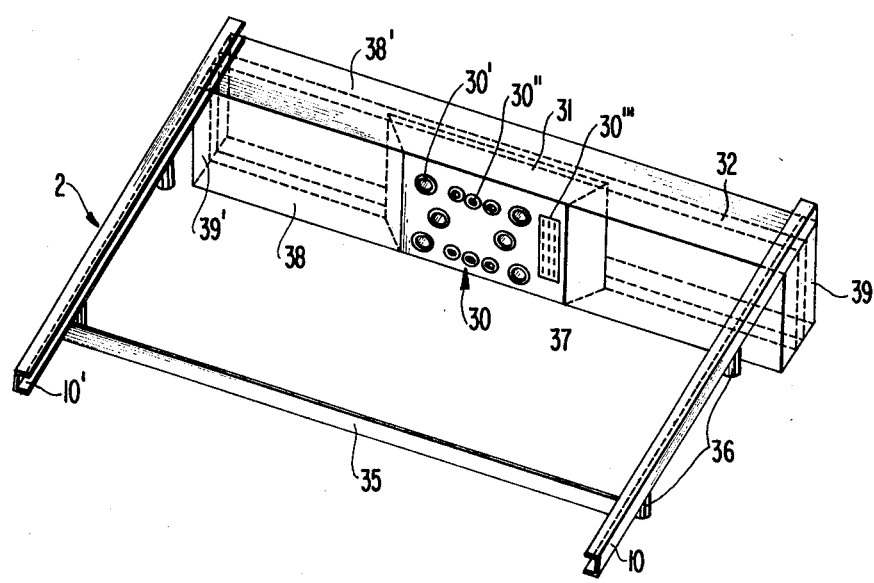
FIG. 2 is a perspective view from in front and from above of a support frame with guide means for the slide-in unit according to FIG. 1.

Referring now to the drawing wherein like reference numerals are used throughout the various views to designate like parts, the structural unit illustrated in FIGS. 1 to 4 includes a slide-in unit generally designated by reference numeral 1 constructed as relatively flat, parallelepiped box for the accommodation of the power electronics and control electronics of an electrically driven vehicle, which box-like unit is displaceable within guide means in a support frame generally designated by reference numeral 2 (FIG. 2) and secured at the vehicle, and which is arranged to be fixed in its completely pushed-in position.

The box-like unit 1 includes a frame 4 welded together of conventional metal profiles, at which are secured its rear boundary wall 5 (FIG. 1) as viewed in the slide-in direction and its lateral boundary walls 6 and 7 as well as a front plate 8 pivotal in hinges (not shown) at the forward lower outer edge.

Figure 3:
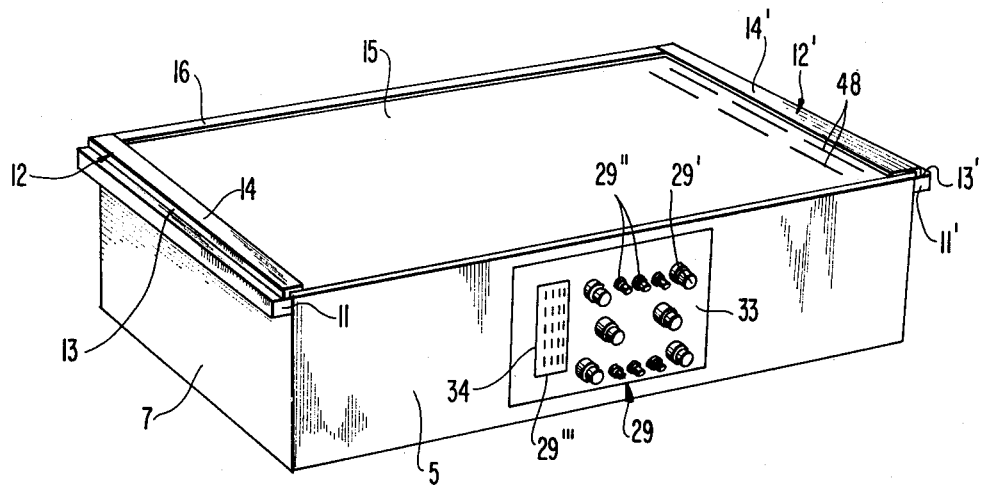
FIG. 3 is a perspective view of the slide-in unit according to FIG. 1, as viewed from the rear, plug-in side thereof.

Hollow profiles 9 and 9' (FIG. 1) which project outwardly beyond the side walls 6 and 7 and which have a square cross section, are welded to the upper lateral metal profiles of the metal frame 4 which extend along the edges of the box; the hollow profiles 9 and 9' extend thereby over the full length of the slide-in unit. The box-like unit 1 is displaceably guided by means of these hollow profiles 9 and 9' in U-shaped profiles 10 and 10' (FIG. 2) of the support frame 2 which extend parallel to one another and have their legs pointing toward one another; the U-shaped profiles 10 and 10' also extend over the full length of the box 1. As illustrated in FIG. 3, further angle rails 12 and 12' having short legs 13 and 13' extending perpendicularly to the upper frame surface and further legs 14 and 14' pointing toward one another and extending parallel to the upper frame surface are welded to the top side of the upper lateral frame profiles 11 and 11'; a top cover plate 15 of the box-like unit 1 is displaceably guided between the angle rails 12 and 12'. The cover plate 15 is retained in its position by means of an edge section 16 (FIGS. 1 and 3) bent off at right angle from the upper edge of the front plate 8 (FIG. 1), which surrounds the forward end edge of the cover plate 15, when the front plate 8 is pivoted in the upper direction whereas the top cover plate 15 can be pulled out, when the front plate 8 is tilted down. The cover plate 15 includes a number of ventilating slots 48 (FIG. 3) through which can escape air heated by the structural elements of the slide-in unit 1 which in part are strongly heat-producing and through which a cooling of these structural elements can take place by convection.

If the slide-in unit 1 is pulled out of the support frame 2, the front plate 8 is tilted downwardly and the cover plate 15 is pulled out, the interior space of the box-like slide-in unit 1 in which are contained the structural elements used for the current supply of the driving motor and for the control of the operating condition thereof, such as, thyristors, power diodes, shunt, relays, fuses, switching elements, armature and field control elements, starting resistance, control installation and the like, is conveniently accessible from in front and from above.

The interior space is subdivided by a partition wall 17 (FIG. 1) extending parallel to the side walls 6 and 7 and made of an insulating material such as "Pertinax", into a narrower structural space 18 in which are accommodated the strongly heat-producing parts of the power electronics including a number of power diodes with cooling bodies 19 and a starting resistance 20, and into a wider structural space 21 including the larger part of the box 1, in which are accommodated the less heat-producing structural elements such as relays 22, fuses, measuring elements and the low current electronics of the control and regulating system for the power electronics.

This structural space is closed off in the downward direction by a bottom plate 23 constructed, for example, as wood-fiber plate, at which the different structural elements are fastened by means of impact nuts impacted into the bottom plate 23 and a screw or bolt screwed-in from above. The bottom plate 23 and the partition wall 17 are so dimensioned that they can be inserted together with the structural elements fastened at the same in the frame of the slide-in unit 1 and can be fastened thereat.

The structural elements used in the control unit are mounted on and/or soldered to printed circuit boards or plug-in cards 24. The plug-in cards are inserted into associated socket strips provided with card guide means 25 (FIG. 1) which are secured at a separate light metal frame 26, at which is also secured a fuse plate 27. This light metal frame 26 is arranged in the forwad part of the larger structural space 21 directly to the rear of the front plate 8 and more particularly in that part thereof which is farthest away from the heat-producing elements 19 and 20. Inside of this frame 26, the plug-in cards or circuit boards are arranged parallel to one another in planes extending perpendicular to the front plate 8 and to the bottom plate 23 so that they are also readily accessible after folding down the front plate 8, when the box-like unit 1 remains pushed-in in the support frame 2. Each of the plug-in boards 24 is provided at its end face facing the front plate 8 with a diagnostic socket 28 (FIG. 1) so that a testing of the plug-in board is possible also with a pushed-in box 1. Similarly, the fuses and corresponding control lamps for the control unit are arranged at the end thereof facing the front plate 8.

The electrical lines, by means of which the structural elements contained in the box 1 are adapted to be connected with the supply battery, are connected with connecting lugs or terminals projecting into the box-like unit of pin-contacts 29 (FIG. 3) of plug-in connections arranged at the rear boundary wall 5 of the box 1, whose complementary sockets 30 are secured in a corresponding arrangement at the support frame 2 in such a manner that the axes of the contact pins 29 projecting a right angle from the outside of the boundary wall 5 and the axes of the contact sockets 30 are aligned with one another and extend parallel to the guide means 9 and 10, when the box-like unit 1 is inserted by means of its guide profiles 9 and 9' into the U-shaped profiles 10 and 10' of the support frame 2.

The sockets 30 are embedded in a thick synthetic plastic plate 31 (FIG. 2) and are so arranged in the same that their openings are disposed in the forward plane of the synthetic plastic plate 31 facing the insert unit 1. The plate 31, in its turn, is secured at a rectangular frame part 32 of the support frame 2 which is welded together at its two upper corners with the rear end sections of the U-shaped profile rails 10 and 10' of the support frame 2. The two U-shaped profile rails 10 and 10' are connected at their forward end facing the box with a cross strut 35 (FIG. 2) for the stable fixing of their mutual spacing, which cross strut 35 is welded to the upper legs of the U-shaped profiles 10 and 10'.

Two rubber pads or buffers 36 (FIG. 2) are mounted at a distance from one another at the respective lower legs of the U-shaped profiles 10 and 10' which are supported on suspensions mounted at the vehicle. It is assured thereby that hard shocks are dampened. In order to protect the cable fastening means at the rear socket parts opposite the insert unit 1 against dirt, the side of the rectangular frame member 32 which faces the insert unit 1 is covered off over the entire width with PVC plates 37 so that only the socket openings remain free. Furthermore, sheet metal cover means 38, 38' and 39, 39' are installed at the lower and upper frame leg of the rectangular frame part 32 and at its lateral legs which protect the rearward parts of the contact sockets mechanically and against soiling.

The contact pins 29 which are also fastened at a synthetic plastic plate 33 forming a part of the rear boundary wall 5 of the box 1, are dimensioned differently, corresponding to the electric power to be transmitted thereby, as illustrated in FIG. 3, whereby the contact pins 29' and 29" connected with the structural elements of the power electronics and with the motor as well as with a ventilating fan have a greater length and thickness than the contact pins 29''' connected with the electronic control system which is constructed as low-current electronic system, which contact pins 29''' are combined into a thirty-terminal unit 34. If the slide-in unit 1 is pushed in into the support frame 2 by means of handles 40 (FIG. 1) arranged at the front end of the metal frame 4, then at first the sturdily constructed and longer contact pins 29' and 29" for the electronic power system come into engagement with the contact sockets 30' and 30" coordinated thereto, as a result of which the contact pins 29''' of the electronic control and regulating system arranged at a very small distance from one another are centered very accurately with respect to their coordinated sockets 30''' so that these contact pins 29''' are not damaged when they finally come into engagement with the contact sockets coordinated thereto during a further slide-in movement of the slide-in unit 1.

Figure 4:
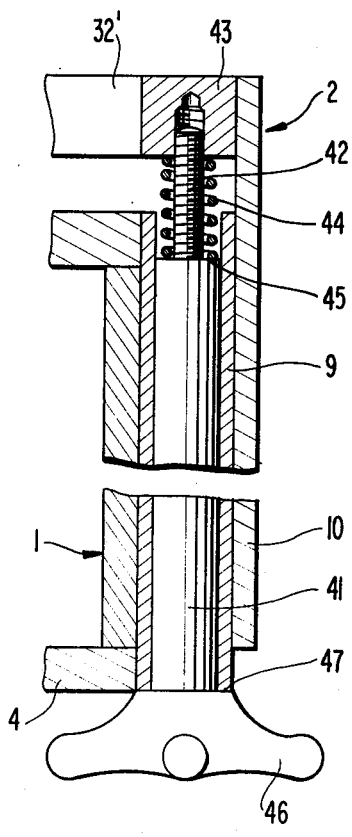
FIG. 4 is a partial cross-sectional view illustrating details of the fastening means between the slide-in unit and the support frame.

The means for fastening the slide-in unit 1 at the support frame 2 which are illustrated in FIG. 4 in partial cross section along the center plane of the hollow profile 9, include a tension rod 41 rotatably supported in the hollow profile 9 whose diameter to corresponds approximately to the clear inner diameter of the hollow profile 9. The tension rod 41 includes at its inner end facing the rectangular frame part 32 of the support frame 2, a threaded section 42 of smaller diameter which engages into a threaded member 43 which is rigidly arranged in the end section of the guiding U-shaped profile 10 welded together with the rectangular frame part 2. The length of the threaded section 42 of the tensional rod 41 is slightly larger than the greatest length of the contact pins 29. The threaded section 42 is concentrically surrounded by a spiral spring 44 whose one end is supported under elastic stress at the end face of the threaded member 43 facing the slide-in unit 1 and whose other end is supported under elastic stress at the inner end surface 45 of the section with larger cross section of the tension rod 41. At its outer end, the tension rod 41 includes a cross-like handle 46 with four equispaced arms which is supported at the forward end surface 47 of the square hollow profile 9 welded to the frame 4 of the slide-in unit.

If the slide-in unit 1 is displaced within the guide rails 9 in the direction toward the plug-in sockets, then at first the spiral spring 44 whose length in the unstressed condition is somewhat greater than the length of the threaded section 42, comes into abutment with the end surface of the threaded member 43 so that during the further sliding-in movement of the slide-in unit 1, until the threaded section 42 is able to come into engagement with the thread of the threaded member 43, a spring-force braking the slide-in movement is exerted by the spiral spring 44. This spring-force can then be overcome in an easy and well-metered manner by rotation of the tension rod 41 with the aid of the cross-handle 46 whereby the contact pins 29 of the slide-in unit 1 come into engagement with the sockets coordinated thereto in the course of a continuous forward movement. When turning back the tension rod 41, the slide-in unit 1 is then pushed back and out again in a continuous movement under the stress of the spiral spring 44 without the need for the assembler to pull at the slide-in unit 1.

In a further embodiment of the present invention which is not illustrated in the drawing, and which is particularly suited for an installation underneath a seat bench of a passenger motor vehicle, the structural unit includes a box-like slide-in unit having a metallic frame in which is mounted or embedded a base plate, in the center area of which is arranged the socket plate of the plug-in connections; the contact pins corresponding to the sockets in the socket plate are fixedly arranged in a trough-shaped recess of the sheet metal floor of the vehicle.

The slide-in unit is provided at its bottom side with rubber legs which keep the same at a distance from the sheet-metal floor member of the vehicle so that supply cables can be laid out in the intermediate space between the sheet metal floor member and the base plate of the slide-in unit. The contact pins are surrounded on all sides by a PVC covering. The guidance of the slide-in unit in the direction toward the contact pins is provided by two cylindrical rods which are surrounded concentrically by helical springs which, in the unstressed condition, keep the slide-in unit at a distance from the contact pins so that the electrical contacts of the plug-in connections are disengaged. It is possible by means of a bolt or screw centrally arranged in the socket plate, which is provided at its top side with a star-shaped handle, to clamp the socket plate in the vertical direction downwardly against the plug-in plate and to keep the slide-in unit in the engaging position of its sockets with the pin contacts of the plug-in plate.

While we have shown and described only one embodiment in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. In an assembly for a vehicle having electrically powered control means and a battery, the improvement comprising: a rack; rubber cushions for flexibly mounting said rack on said vehicle; guide means on said rack; a module; guide means on said module for engaging said rack guide means to enable said module to be removeably inserted in said rack; components on said module for regulating said control means; a plurality of first electrically conducting socket means on one of said rack and said module; a plurality of first electrically conducting complementary plug-in contact means on the other of said rack and said module for engaging said first socket means; second electrically conducting socket means on one of said rack and said module; and second electrically conducting complementary plug-in contact means on the other of said rack and said module for engaging said second socket means, the first and second electrically conducting means on said module being connected to said components, the first electrically conducting means on said rack being connected to said control means, and the second electrically conducting means on said rack being connected to said battery, said second electrically conducting complementary plug-in contact means being of a robust construction, said first electrically conducting complementary plug-in contact means being weakly constructed in comparison to said first electrically conducting complementary plug-in contact means and said second electrically conducting plug-in contact means providing additional guidance for insertion of said module by exactly centering said first electrically conducting complementary plug-in contact means relative to said first electrically conducting socket means prior to their plug-in engagement.

2. Assembly according to claim 1, characterized by the fact that the openings of the sockets are arranged in a common plane and the bases of the contact pins of the plug-in module are disposed in a plane parallel thereto, and by the fact that the contacts which provide additional guidance have a greater length than the other contacts.

3. Assembly according to claim 1 characterized by the fact that both a cover plate and a front panel are made foldable against the plug-in module which is essentially cuboidal and by the fact that the front plate is swivelable on hinges about its longer edge.

4. Assembly according to claim 1, characterized by the fact that the components contained in the plug-in module are collected into pre-assembled groups and are mounted individually removeably in the plug-in module.

5. Assembly according to claim 1, characterized by the fact that partitions are provided in the plug-in module to protect sensitive components from elements which develop heat.

6. In an assembly for a vehicle having electrically powered control means and a battery, the improvement comprising: a rack mounted on said vehicle; U-shaped guide tracks on said rack; a module; hollow profile guide means disposed on upper opposite edges of said module, said guide means being displaceably receivable in said guide tracks to enable said module to be removably inserted in said rack; tightening screws rotatably mounted within said hollow profile guide means; a threaded aperture being formed as a part of said rack for receiving each of said screws, said screws extending in the longitudinal direction of said guide means, beyond a first end thereof for engagement with said apertures, and beyond a second end thereof for manipulation in securing said module to said rack; components on said module for regulating said control means; a plurality of first electrically conducting socket means on one of said rack and said module; a plurality of first electrically conducting complementary plug-in contact means on the other of said rack and said module for engaging said first socket means; second electrically conducting socket means on one of said rack and said module; and second electrically conducting complementary plug-in contact means on the other of said rack and said module for engaging said second socket means, the first and second electrically conducting means on said module being connected to said components, the first electrically conducting means on said rack being connected to said control means, and the second electrically conducting means on said rack being connected to said battery, said second electrically conducting complementary plug-in contact means being of a robust construction; said first electrically conducting complementary plug-in contact means being weakly constructed in comparison to said first electrically conducting complementary plug-in contact means, and said second electrically conducting complementary plug-in contact means providing additional guidance for insertion of said module by exactly centering said first electrically conducting complementary plug-in means relative to said first electrically conducting socket means prior to their plug-in engagement.

7. A structural unit for an electric vehicle which contains electrical, electronic and electromechanical structural elements for the control and regulation of the operating currents and operating voltages, characterized by a support frame means adapted to be fixedly connected with the vehicle and provided with guide means, a box-shaped slide-in means matched to the support frame means and also provided with guide means, complementary plug-in contact means arranged at corresponding places of the support frame means and of the slide-in means for establishing the electrical contacts, the complementary plug-in contact means including socket means and contact-pin means having different lengths, the socket means being arranged in a common plane at a plate of the support frame means extending substantially perpendicularly to the guide direction, and the contact pin means being arranged at a rear wall of the slide-in means extending substantially parallel to said plate, base points of the contact means being arranged in a plane substantially parallel to the plane of the socket means, said slide-in means including a removable cover plate and a front plate adapted to be folded down, and clamping means for holding the slide-in means in the support frame means being provided in the direction of the guide means, wherein a part of the plug-in contact means are constructed as additional guide means for the slide-in movement, and being further characterized in that the guide means of the support frame means include U-shaped profile rail means having legs pointing to one another, the guide means of the slide-in means including hollow profile means fixedly arranged at the side walls of the slide-in means and displaceably guided in the U-shaped profile rail means, and the clamping means being rotatably supported in said hollow profile means.

8. A structural unit according to claim 1, characterized in that the clamping means are provided at their inner ends with a threaded section cooperating with nut means of the support frame means and being supported at their outer end against the outside of the slide-in means.

9. A structural unit according to claim 8, characterized in that the box-like slide-in means is supported with respect to the support frame means in its end section of its slide-in path which is somewhat greater than the greatest length of the contact pin means by way of spring-elastic elements.

10. A structural unit according to claim 9, characterized in that coil springs are arranged as spring-elastic elements on an inner offset end section of the clamping means.

11. A structural unit according to claim 10, characterized in that the box-like slide-in means is constructed essentially parallelepiped and flat and includes parallel guide means for the displaceable and removable cover plate.

12. A structural unit according to claim 11, characterized in that the front plate is pivotal in hinge means about its lower edge.

13. A structural unit according to claim 12, characterized in that the structural elements contained in the slide-in means are combined in their turn to preassembled groups and are mounted in the slide-in means disengageable independently of one another.

14. A structural unit according to claim 13, characterized in that partition wall means are provided in the slide-in means for the protection of sensitive structural parts from other elements.

15. A structural unit according to claim 14, characterized in that said other elements are heat-producing elements.

16. A structural unit according to claim 14, characterized in that the clamping means include each a clamping bolt having a threaded portion.

17. A structural unit for an electric vehicle which contains electrical, electronic and electromechanical structural elements for the control and regulation of the operating currents and operating voltages, characterized by a support frame means adapted to be fixedly connected with the vehicle and provided with guide means, a box-shaped slide-in means matched to the support frame means and also provided with guide means, complementary plug-in contact means arranged at corresponding places of the support frame means and of the slide-in means for establishing the electrical contacts, said slide-in means including a removable cover plate and a front plate adapted to be folded down, and clamping means for holding the slide-in means in the support frame means, characterized in that the guide means of the support frame means include U-shaped profile rail means having legs pointing to one another, the guide means of the slide-in means including hollow profile means fixedly arranged at the side walls of the slide-in means and displaceably guided in the U-shaped profile rail means, and the clamping means being rotatably supported in said hollow profile means.

* * * * *